(12) United States Patent
Tsukran

(10) Patent No.: US 12,496,448 B2
(45) Date of Patent: Dec. 16, 2025

(54) METHOD AND SYSTEM FOR ELECTRICAL NERVE STIMULATION

(71) Applicant: Nyxoah SA, Mont Saint Guibert (BE)

(72) Inventor: Roi Moshe Tsukran, Ramat Gan (IL)

(73) Assignee: Nyxoah SA, Mont-St-Guibert (BE)

( * ) Notice: Subject to any disclaimer, the term of this patent is extended or adjusted under 35 U.S.C. 154(b) by 639 days.

(21) Appl. No.: 17/612,417

(22) PCT Filed: May 18, 2020

(86) PCT No.: PCT/EP2020/063859
§ 371 (c)(1),
(2) Date: Nov. 18, 2021

(87) PCT Pub. No.: WO2020/234253
PCT Pub. Date: Nov. 26, 2020

(65) Prior Publication Data
US 2022/0203089 A1   Jun. 30, 2022

Related U.S. Application Data

(60) Provisional application No. 62/850,077, filed on May 20, 2019.

(51) Int. Cl.
*A61N 1/36* (2006.01)
*A61N 1/05* (2006.01)
*A61N 1/372* (2006.01)

(52) U.S. Cl.
CPC .......... *A61N 1/3611* (2013.01); *A61N 1/0548* (2013.01); *A61N 1/3615* (2013.01);
(Continued)

(58) Field of Classification Search
CPC .. A61N 1/0548; A61N 1/3611; A61N 1/3615; A61N 1/36171; A61N 1/36175;
(Continued)

(56) References Cited

U.S. PATENT DOCUMENTS

| 5,944,680 A | 8/1999 | Christopherson et al. |
| 2013/0072999 A1 | 3/2013 | Mashiach |

(Continued)

FOREIGN PATENT DOCUMENTS

| WO | WO 2004/064729 A2 | 8/2004 |
| WO | WO 2009/051536 A1 | 4/2009 |
| WO | WO 2011/059531 A1 | 5/2011 |

OTHER PUBLICATIONS

International Search Report and Written Opinion mailed Nov. 26, 2020, in PCT International Application PCT/EP2020/063859, 20 pages.

(Continued)

*Primary Examiner* — Amanda K Hulbert
(74) *Attorney, Agent, or Firm* — Finnegan, Henderson, Farabow, Garrett & Dunner, LLP

(57) ABSTRACT

Disclosed herein is a method for electrical nerve (510) stimulation, the method comprising: generating an electrical stimulation pattern (100) comprising a plurality of successive pulse trains (110), wherein each pulse train (110) has a pulse train amplitude (111); delivering the electrical stimulation pattern (100) to a subjects hypoglossal nerve (510) with a stimulator (300) having at least one electrode (310); modulating the electrical stimulation pattern (100), wherein modulation of the electrical stimulation pattern (100) comprises gradually increasing the pulse train amplitude (111) from one pulse train (110) to a successive pulse train (110) at stimulation onset (101) until a determined target stimulation amplitude (130) is reached; characterized in that modulation of the electrical stimulation pattern (100) further comprises decreasing the target stimulation amplitude (130) to a defined step-down amplitude (140) within each pulse train (110) after the target stimulation amplitude (130) was reached.

26 Claims, 6 Drawing Sheets

(52) U.S. Cl.
CPC ..... *A61N 1/36171* (2013.01); *A61N 1/36175* (2013.01); *A61N 1/36178* (2013.01); *A61N 1/36192* (2013.01); *A61N 1/37235* (2013.01)

(58) Field of Classification Search
CPC ............ A61N 1/36178; A61N 1/36192; A61N 1/37211; A61N 1/37235
See application file for complete search history.

(56) References Cited

U.S. PATENT DOCUMENTS

| | | |
|---|---|---|
| 2013/0085537 A1 | 4/2013 | Mashiach |
| 2013/0289667 A1* | 10/2013 | Wacnik .............. A61N 1/36171 607/2 |
| 2014/0228905 A1 | 8/2014 | Bolea |
| 2014/0358189 A1 | 12/2014 | Mashiach et al. |
| 2016/0089540 A1* | 3/2016 | Bolea ...................... A61F 5/566 607/42 |

OTHER PUBLICATIONS

Office Action mailed Dec. 28, 2022, by the Japanese Patent Office in counterpart Japanese Application No. 2021-568888, 23 pages.
Office Action mailed Mar. 19, 2025, by the Chinese Patent Office in counterpart Chinese Application No. 202080050740X, 10 pages.

* cited by examiner

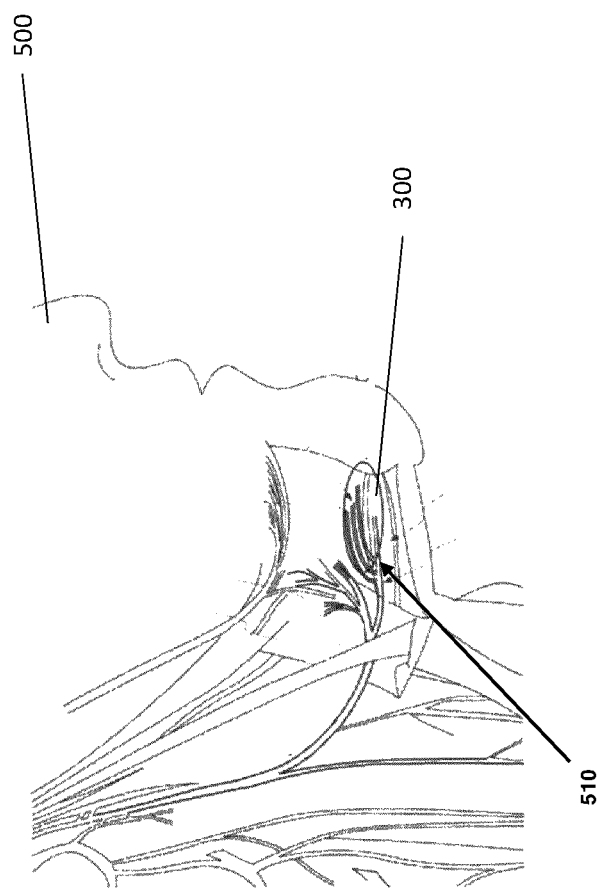

METHOD AND SYSTEM FOR ELECTRICAL NERVE STIMULATION

This application is a U.S. national stage entry application under 35 U.S.C. § 371 from PCT International Application No. PCT/EP2020/063859, filed on May 18, 2020, which claims benefit of U.S. provisional Application No. 62/850,077, filed on May 20, 2019; the contents of each application is incorporated herein by reference in its entirety.

TECHNICAL FIELD

The disclosed subject matter described hereafter refers to a method and a system for electrical nerve stimulation and in particular for adjusting parameter values for stimulation. Furthermore, reference is made to a use of the method for electrical nerve stimulation to correct sleep disordered breathing.

BACKGROUND

Neural modulation, e.g. electrical stimulation of nerves, is—known in the prior art as a reliable and effective type of medical treatment. It presents the opportunity to tackle many physiological conditions and disorders by interacting with the body's own natural neural processes. Neural modulation includes inhibition (e.g. blockage), stimulation, modification, regulation, or therapeutic alteration of activity, electrical or chemical, in the central, peripheral, or autonomic nervous system. By modulating the activity of the nervous system, several different goals may be achieved. For instance, motor neurons may be stimulated at appropriate times to cause muscle contractions. Further, sensory neurons can be blocked to relieve pain or stimulated to provide a signal to a subject. In yet other examples, modulation of the autonomy nervous system may be used to adjust various involuntary physiological parameters, such as heart rate and blood pressure. Neural modulation may provide the opportunity to treat several diseases or physiological conditions. Various devices and techniques have been used in attempts to provide optimum stimulation of a tissue of interest.

Typically, neural stimulators deliver therapy in the form of electrical pulses and include one or more electrode in a proximity of the target location, such as a specific nerve or section thereof. Electrical stimulation is programmable and adjustable through various parameters, such as the polarity of electrode(s), voltage, current amplitudes, pulse frequency, pulse width, and others as these define the electrical stimulation therapy to be delivered to the user in need of therapy. Such parameters may be preprogrammed or programmable to deliver the desired stimulation and end result desired from the stimulation therapy.

One of the conditions to which neural modulation can be applied to is obstructive sleep apnea (OSA), a respiratory disorder characterized by recurrent episodes of partial or complete obstruction of the upper airway during sleep. One of the causes of OSA is the inability of the tongue muscles to resist negative inspiratory pressure in the pharynx due to the sleep-related loss in muscle tone. As the tongue is pulled backwards, it obstructs the upper airway, decreasing ventilation and lowering lung and blood oxygen levels. Stimulation of the hypoglossal nerve for example causes the tongue muscles, e.g. the genioglossus muscle, to contract, thereby maintaining an open, unobstructed airway as the genioglossus muscle is responsible for the forward movement of the tongue as well as for the stiffening of the anterior pharyngeal wall.

PRIOR ART

Various devices, systems and methods have been disclosed in the prior art that relate to electrical stimulation therapy and neurostimulation in particular. For example, US 2013/0289667 A1 discloses devices, systems, and techniques for ramping one or more parameter values of electrical stimulation. An implantable medical device may increase or decrease a parameter value, e.g., amplitude or pulse width, over time to reach a target value of the parameter.

SUMMARY OF THE DISCLOSED SUBJECT MATTER

One of the objectives of the present disclosure is to respond to the disadvantages of the prior art and provide an improved system and method for electrical nerve stimulation in a recipient of the stimulation. In particular, in accordance with the disclosed subject matter, the system and method are intended to decrease the discomfort that could be caused by electrical nerve stimulation, as well as be energy efficient, safe and reliable when applied. In addition, a use of said method as well as a system for electrical nerve stimulation is needed in order to maximize therapy efficacy for patients with OSA.

According to one aspect of the disclosure, there is provided a method of compensating for a positional change of an implantable electrical stimulator and an external device configured to activate the implantable electrical stimulator. Such implantable electrical stimulator may be implantable in a vicinity of a muscle and an associated nerve. In one example such a muscle may be the genioglossus muscle and the nerve may be a hypoglossal nerve. The method comprises: generating an electrical stimulation pattern through an electrical communication between the external activation device and the implantable electrical stimulator to stimulate a subject's nerve thereby contracting the associated therewith muscle, resulting in position change of the implantable stimulator respective the external activation device and adjusting stimulation parameters transmitted by the external activation device of the stimulation to compensate for the positional change of the implantable electrical stimulator with respect to the activation device to substantially maintain the electrical stimulation intensity by compensating the positional change of the implant with respect to the external activation device. Such an external device in accordance with an example may be a transmitting element. The transmitting element may comprise an antenna or a coil which in turn may be associated with a control unit. Such a control unit may further comprise a power source. In one embodiment, such a control unit may wirelessly transmit activation input, e.g. stimulation parameters, and power through the transmitting device to the implant. Such a combination of the external device and the control unit may constitute an external activation device.

The stimulation parameters may be adjusted automatically based on the degree of coupling between the stimulator and the external activation device or these parameters can be preprogrammed to respond to the presumed positional change (for example, based on titration process as will be further discusses herein). Such a positional change in accordance with the disclosed subject matter can be change in distance between the stimulator and the activation device, angular change therebetween, etc.

Adjustment or modulation of the electrical stimulation pattern may comprise decreasing a target stimulation amplitude to a defined step-down amplitude within each pulse train after the target stimulation amplitude was reached. Variations to other parameters may also be applied, either as an alternative or in combination with the variation to the stimulation amplitude. It will be appreciated that this and other definitions apply to all aspects of the disclosed subject matter, mutatis mutandis.

In accordance with another aspect of the disclosed subject matter, a method for electrical nerve stimulation is provided, wherein the method comprises: generating an electrical stimulation pattern comprising a plurality of successive pulse trains, wherein each pulse train has a stimulation amplitude; delivering the electrical stimulation pattern to a patient's tongue with a stimulator having at least one electrode; modulating the electrical stimulation pattern, wherein modulation of the electrical stimulation pattern comprises gradually increasing the stimulation amplitude from one pulse train to a successive pulse train at stimulation onset until a determined target stimulation amplitude is reached. The method is characterized in that modulation of the electrical stimulation pattern further comprises decreasing the target stimulation amplitude to a defined step-down amplitude within each pulse train after the target stimulation amplitude was reached.

Decreasing the target stimulation amplitude to a defined step-down amplitude within each pulse train as disclosed herein can simply be referred to as "step-down". This step-down has at least two major advantages. One advantage lies in the fact that nerve fibers that have been initially affected or triggered via a stimulation signal need not necessarily be further stimulated with the same amount energy, i.e. a lower stimulation amplitude or frequency might be as efficient in maintaining nerve affection as the initial amplitude or frequency. Also, once a muscle has been engaged via stimulation it will contract. As soon as such a muscle contraction has been activated, the distance between an external device generating the stimulation in the muscle and the muscle itself will be decreased, since at least a part of the muscle will be closer to the skin surface of a patient due to contraction. Thus, the distance between the external device and the stimulator is decreased. At the same time, less intervening tissue will be located between the external device and the stimulator. Intervening tissue may include muscle tissue, connective tissue, organ tissue, or any other type of biological tissue. Again, this means that a lower stimulation amplitude or frequency might be needed to maintain recruitment of the muscle as compared to the initial amplitude or frequency.

Since an intense stimulation (e.g. a relatively high amplitude and/or frequency of the pulses of each pulse train of stimulation pattern) may cause discomfort or, in some cases, even pain in the patient, a lower stimulation intensity will be perceived as more comfortable by the subject. For example, a subject may tolerate electrical stimulation with higher pulse frequencies and for longer time periods if the stimulation amplitude is reduced. Furthermore, lower stimulation intensity leads to the method being more energy efficient or battery-saving than a method having a continuously higher stimulation intensity than actually required.

This step-down, e.g. the decreasing of the target stimulation amplitude to a defined step-down amplitude within each pulse train after the target stimulation amplitude was reached, may also be implemented in conjunction with the gradual increase to the stimulation amplitude from one pulse train to a successive pulse train at stimulation onset until a determined target stimulation amplitude is reached. Such increase may be referred to as "train ramp up". It will be appreciated that such a ramp up may be implemented from the stimulation onset and until the end of the stimulation, leading to the target stimulation parameter which may be determined in advance. Such a stimulation period can be throughout the therapy period, which in the case of OSA could be the period during which the user is sleeping. Such a period can be anywhere from 30 minutes and up to several hours as desired, depending on the sleep cycle of the user. It will be appreciated that the step down may be alternatively implemented through other stimulation parameters or in combination with the amplitude adjustments.

The electrical stimulation pattern comprises a pulse train stimulation, which is made of alternating ON and OFF phases or trains. The lengths of the ON phases are called train length and the lengths of the OFF phases are called train interval. The ON phase of a train stimulation is made of successive pulses characterized by an amplitude, a duration and an interval. Two other important parameters are frequency and duty cycle, wherein the duty cycle is defined as the percentage of one train during which the stimulation is on.

The gradual increase of the stimulation amplitude from one pulse train to a successive pulse train at stimulation onset consists of gradually increasing the stimulation amplitude from one stimulation train to another until a target stimulation amplitude is reached. Thus, awaking the patient after initialization of the stimulation can be avoided. The gradual increase feature may, for example, include only one configurable parameter, namely duration, i.e. a period a time just after the delay time during which the amplitude will increase gradually.

This feature's purpose is to increase therapy acceptance by gradually increasing the amplitude up to the target stimulation amplitude (in order to open the upper airway without waking up the patient), to hold this target stimulation amplitude during a shorter period of time and then decrease the amplitude as the force needed to maintain the upper airway open should be lower than the one needed to open a closed upper airway.

Thus, as a patient receives therapy over time, he or she may select, or the system may automatically select, different modulation programs to change the electrical stimulation pattern.

According to one embodiment disclosed herein, the method is further characterized in that the target stimulation amplitude is decreased to the step-down amplitude in an abrupt manner. In other words, decreasing the target stimulation amplitude to a defined step-down amplitude within each pulse train after the target stimulation amplitude was reached may involve one distinct drop in amplitude until the defined step-down amplitude is reached. It is also possible that more drops to one or more intermediate amplitudes are executed before the defined step-down amplitude is reached, thereby creating a gradual stepping down of the pulse. The duration of each intermediate amplitude may then be the same for each intermediate amplitude, or it may vary. Once the step-down amplitude was held for a defined duration, amplitude is dropped, or continuously decreased, to about 0.

The method may further be characterized in that the target stimulation amplitude within each pulse train is reached according to a ramp-up function comprising a ramp-up duration, wherein the ramp-up duration is defined as the time it takes for the stimulation amplitude to reach the target stimulation amplitude. The time point in time within each pulse train, at which the defined target stimulation amplitude is reached, may be referred to as ramp-up point.

The target stimulation amplitude may be maintained for a defined hold duration before it is decreased to the step-down amplitude. According to a preferred embodiment, the hold duration ranges from 0 msec to 1000 msec, in particular from 0 msec to 500 msec, wherein the hold duration is defined as the duration of the period during which a target stimulation amplitude is maintained within one stimulation train.

It is also possible that each the successive pulse trains are separated by pulse train intervals. According to a preferred embodiment, each pulse train comprises a plurality of successive single pulses, wherein each single pulse has a single pulse amplitude and a single pulse duration and wherein successive pulses are separated by single pulse intervals. The method disclosed herein may be further characterized that each pulse train has a pulse train length, a single pulse frequency and a duty cycle.

The method may further be characterized in that the modulation of the electrical stimulation pattern is based on determination of a degree of coupling between a primary antenna associated with an external device and a secondary antenna associated with a stimulator. The primary antenna may be configured as part of a circuit within the external device and may be coupled either directly or indirectly (including wirelessly) to various components in the external device. For example, the primary antenna may be configured for communication with an amplifier, which may also be included in the external device and which may output the amplified signal to the primary antenna.

The primary antenna may include any conductive structure that may be configured to create an electromagnetic field. The primary antenna may further be of any suitable size, shape, and/or configuration. The size, shape, and/or configuration may be determined by the size of the patient, the placement location of the stimulator, the size and/or shape of the stimulator, the amount of energy required to modulate a nerve, a location of a nerve to be modulated, the type of receiving electronics present on the stimulator, etc. The primary antenna may include any suitable antenna known to those skilled in the art that may be configured to send and/or receive signals. Suitable antennas may include, but are not limited to, a long wire antenna, a patch antenna, a helical antenna, etc. In one embodiment, for example the primary antenna may include a coil antenna. Such a coil antenna may be made from any suitable conductive material and may be configured to include any suitable arrangement of conductive coils.

The stimulator may include a secondary antenna mounted onto or integrated with a carrier (e.g. a flexible carrier). Similar to the primary antenna, the secondary antenna may include any suitable antenna known to those skilled in the art that may be configured to send and/or receive signals. The secondary antenna may include any suitable size, shape, and/or configuration. The size, shape and/or configuration may be determined by the size of the patient, the placement location of the stimulator or the amount of energy required to modulate the nerve. Suitable antennas may include, but are not limited to, a long-wire antenna, a patch antenna, a helical antenna. In some embodiments, for example, the secondary antenna may include a coil antenna having a circular shape or an oval shape. Such a coil antenna may be made from any suitable conductive material and may be configured to include any suitable arrangement of conductive coils (e.g. diameter, a number of coils, a layout of coils, etc.).

In further developments of the method, the electrical stimulation pattern further comprises a confirmatory pulse and a delay time. The confirmatory pulse is defined as the amplitude of a single first pulse emitted immediately after a connection between the external device and the stimulator has been established. The confirmatory pulse is described as a unit percentage of total system output. Accordingly, the delay time is defined as the time between connection of external device and stimulator has and the beginning of the stimulation.

In addition to the above, the duration of the gradual increase of the stimulation amplitude from one pulse train to a successive pulse train at stimulation onset ranges from 0 min to 60 min, in particular from 0 min to 30 min.

It may furthermore be intended that the ramp-up duration ranges from 0 msec to 2000 msec, in particular from 0 msec to 1000 msec, wherein he ramp-up duration is the duration of gradual increase of the amplitude within each stimulation train.

It is also possible that the step-down amplitude has an amplitude from 1% to 99%, in particular from 1% to 90%, of the total system output amplitude. It may also be intended that the stimulation amplitude has an amplitude from 1% to 100% of a total system output amplitude. The method may further be characterized in that the duration of the pulse train interval ranges from 0.1 sec to 20 sec, in particular from 0.2 sec to 10 sec. In addition to the above, the single pulse duration ranges from 5 μsec to 500 μsec, in particular from 50 μsec to 250 μsec. The method disclosed herein may be further characterized that the duration of the pulse train length ranges from 0.1 sec to 20 sec, in particular from 0.2 sec to 10 sec and that the single pulse frequency ranges from 10 Hz to 100 Hz, in particular from 30 to 50 Hz. In accordance with another beneficial embodiment, the confirmatory pulse has an amplitude from 1% to 100% of the total system output amplitude and that the duration of the delay time ranges from 0 min to 120 min, in particular from 0 min to 90 min.

Preferably, of all the above parameters, those that can be modified are the following: single pulse frequency, single pulse duration, overall stimulation amplitude, pulse train length, pulse train interval, delay time, confirmatory pulse and ramp functions. Total cycle length and duty cycle may automatically be calculated once the other parameters are set.

According to another aspect of the disclosure, a use of the inventive method for electrical nerve stimulation in a wakeful titration is presented. In order to optimize a patient's therapy, a use of the method disclosed herein is provided. According to this aspect, the it is intended that the patient returns to the hospital for one or more titration visits. The stimulation pattern parameters disclosed herein will be refined and or adjusted during wakeful and/or asleep sessions, i.e. via sleep study or polysomnography ("PSG"), until reaching a group of settings that will not lead to waking the patient but that will at same time maintain upper airway potency, oxyhemoglobin saturation and sleep continuity.

Therefore, a wakeful titration is first performed according to a defined set of therapy guidelines while the subject is awake. During the wakeful titration, one or more distinct stimulation thresholds may be identified. Once those thresholds are defined, the optimal set of awake parameters for a given patient may be determined and stored based on that patient's tongue movement characteristics.

This way, it is made possible to identify the tongue movement characteristics, direction, and intensity as well as stimulation thresholds help defining optimal therapeutic parameters without anesthesia or endoscopy.

The use disclosed herein may be further characterized in that the method is used to define a motor threshold stimulation amplitude for a defined single pulse frequency and a defined single pulse duration. The motor threshold is defined as a minimum threshold that, when applied, leads to a motion or a movement of the tongue or the hypoglossal muscle is first noted. This can be done, for example, by a trained doctor or physician or by any other suitable therapist.

Additionally, the method may be used to define a pain threshold stimulation amplitude for a defined single pulse frequency and a defined single pulse duration. The pain threshold is defined as minimum threshold that, when applied, leads to a feeling of unpleasantness, discomfort or pain in a subject. It can be determined, for example, by surveying the subject.

As part of another embodiment, the method described herein may be used in a wakeful endoscopy. During a wakeful endoscopy, an airway opening amplitude at each site of opening may be defined by the minimal amplitude required to observe an airway opening during stimulation. Likewise, a plateau amplitude at each site of opening may be defined by the amplitude threshold where no further increase of airway opening is observed or above which a decrease of the airway opening is observed.

In addition to the above, the method may be used to define an airway opening amplitude, wherein the airway opening amplitude is the minimum stimulation amplitude required to cause an opening of the subject's airway during stimulation.

The method may also be used to a define plateau amplitude, wherein the plateau amplitude is the maximum stimulation amplitude above which no further increase of the opening of the subject's airway is caused.

It may also be intended that the method is used in a polysomnography titration. A polysomnography (PSG) titration allows for configuration and optimization of stimulation parameters until a desired group therapeutic settings is reached, i.e. settings that do not wake the participant but at the same time maintain upper airway potency, oxygen saturation levels and sleep continuity. During PSG titration, if sleep events occur, one stimulation parameter may be changed at a time following a defined order. For instance, the stimulation amplitude may be increased, for example by about 5%. If increasing amplitude is not supported by the patient or has a reverse effect, single pulse duration may be increased, for example by increments of 20 microseconds. If increasing the single pulse duration is not supported by the patient, duty cycle may be adapted to match with patient's breathing cycle. The PSG titration stimulation may, for example, begin after the patient is asleep for a minimum of 20 minutes. The stimulation pattern parameters can be refined according to the desired set of therapy guidelines until certain settings are reached that do not wake the patient and that maintain upper airway potency, oxyhemoglobin saturation, and sleep continuity. These settings, which may be stored as optimal settings, can be maintained over the entire night. PSG and respiratory parameters may further be recorded until the patient's final wake-up. During the night, it may be necessary to perform further adjustments of electrical stimulation parameters.

According to yet another aspect of the disclosure, a system for electrical nerve stimulation to correct sleep disordered breathing is provided, the system comprising a stimulator having at least one electrode; an external device, wherein the external device is configured for communication with the stimulator and wherein the external device comprises a processor configured to: generate an electrical stimulation pattern comprising a plurality of successive pulse trains, wherein each pulse train has a stimulation amplitude; deliver the electrical stimulation pattern to a subject's hypoglossal nerve through the stimulator; modulate the electrical stimulation pattern according to a stimulation program, wherein modulation of the electrical stimulation pattern comprises gradually increasing the stimulation amplitude from one pulse train to a successive pulse train at stimulation onset until a determined target stimulation amplitude is reached and wherein the modulation of the electrical stimulation pattern further comprises decreasing the target stimulation amplitude to a defined step-down amplitude within each pulse train after the target stimulation amplitude was reached.

The system may be configured for neuromodulation of a patient's hypoglossal muscle. More particularly, the system may be configured to deliver energy in a patient with OSA. The system may therefore include an external device configured for location external to the patient's body. The external device may further be configured to be affixed to the patient. In particular, the external device may be configured for placement adjacent the implanted stimulator, for example underneath the patient's chin and/or on the front of patient's neck or remote from the subjects body. The suitability of placement locations may be determined by communication between the external device and the stimulator. In some embodiments, the stimulator may be configured as a device to be implanted into the body of a patient, and external deice may be configured to send signals to and/or receive signals from the stimulator. The stimulator may be formed from any suitable material. In some embodiments, the stimulator may include a flexible carrier including a flexible, biocompatible material. The stimulator may further include circuitry including conductive materials, such as gold, platinum, titanium, or any other biocompatible conductive material or combination of materials. The stimulator may also be fabricated with a thickness suitable for implantation under a patient's skin. The stimulator may have thickness of less than about 4 mm or less than about 2 mm.

Various components may be included within a housing of the external device or otherwise associated with the external device. In particular, at least one processor is associated with the external device. For example, the at least one processor can be located within the housing of the external device. In alternative embodiments, the at least one processor may be configured for wired or wireless communication with the external device from a location external to the housing. The housing may include any suitable container configured for retaining components. In addition, the housing may be any suitable size and/or shape and may be rigid or flexible. Exemplary embodiments of housings for the external device include one or more of patches, buttons, or other receptacles having varying shapes and dimensions and being constructed of any suitable material. In one embodiment, for example, the housing may include a flexible material such that the external device may be configured to conform to a desired location.

The at least one processor may include any electric circuit that may be configured to perform a logic operation on at least one input variable. The at least one processor may therefore include one or more integrated circuits, microchips, microcontrollers, and microprocessors, which may be all or part of a central processing unit (CPU), a digital signal processor (DSP), a field programmable gate array (FPGA), or any other circuit known to those skilled in the art that may be suitable for executing instructions or performing logic operations.

The stimulator may additionally include at least one pair or a plurality of field-generating electrodes. The electrodes may include any suitable shape and orientation on the stimulator so long as the electrodes may be configured to generate an electric field in the body of a patient. The electrodes may also include any suitable conductive material like copper, silver, gold, platinum, iridium, platinum-iridium, platinum-gold, conductive polymers, etc. or combinations of conductive materials. In some embodiments the electrodes may include short line electrodes, circular electrodes, and/or circular pairs of electrodes. Additionally, the stimulator may include electrodes located at a plurality of locations.

The system may further be characterized in that the system further comprises a user interface configured to enable a user to adjust and/or select the stimulation program, wherein at least of a group of stimulation pattern parameters is adjustable.

It may also be intended that the group of stimulation pattern parameters comprises a stimulation amplitude, a pulse train length, a single pulse frequency, a single pulse duration, a target stimulation amplitude, a hold duration, a step-down amplitude, a ramp-up duration, a pulse train interval, a duty cycle and/or a delay time. The external device may further comprise a memory configured to store at least one stimulation program. For example, patient-specific stimulation pattern parameters programmed by the treating professional.

According to another preferred embodiment, the external device further comprises a disposable patch configured to be connectable to the processor. In particular, the processor may be attached to one or more disposable patches, which in turn may be and placed on a patient's skin, for example under the chin, and in some examples via at least one adhesive surface of the disposable patch. To activate and discontinue the stimulation, the disposable patch, connected to the processor, may be placed by the subject under the chin prior to a stimulation session or before going to sleep and removed in the morning. The power source of the processor may be recharged during the day using the charging unit.

Advantageously, the disposable patch may be single-use biocompatible adhesive device that is placed under a patient's chin prior going to a stimulation session or prior to sleep. The processor fits onto the disposable patch and allows the activation of the stimulator by transferring energy. In a preferred embodiment, energy transfer occurs wirelessly.

According to a further development of the system, the external device may comprise a power source. The power source may be removably couplable to the external device at an exterior location relative to the external device. Alternatively, the power source may further be permanently or removably coupled to a location within the external device. The power source may also include any suitable source of power configured to be in electrical communication with the processor. In one preferred embodiment, for example the power source may include a battery. The power source may be configured to power various components within the external device. It may further be configured to provide power to the processor. In addition, the power source may be configured to provide power to a signal source. The signal source can be in communication with the processor and may include any device configured to generate a signal (e.g. a sinusoidal signal, square wave, triangle wave, microwave, radio-frequency (RF) signal, or any other type of electromagnetic signal). The signal source may include, but is not limited to, a waveform generator that may be configured to generate alternating current (AC) signals and/or direct current (OC) signals. In one embodiment, for example, signal source may be configured to generate an AC signal for transmission to one or more other components. The signal source may be configured to generate a signal of any suitable frequency. In some embodiments, the signal source may be configured to generate a signal having a frequency of from about 6.5 MHz to about 13.6 MHz. In additional embodiments, the signal source may be configured to generate a signal having a frequency of from about 7.4 to about 8.8 MHz. In further embodiments, the signal source may generate a signal having a frequency as low as 90 kHz or as high as 28 MHz.

The system disclosed herein may be further characterized that the system further comprises a remote control device. The remote control can, for example, be implemented in a mobile device.

With a remote control, the stimulation pattern parameters of the system may be adjusted in a more convenient manner by a therapist or by the subject.

As part of another embodiment of this system, the system further may comprise a wireless control device configured to: wirelessly communicate with the processor; and wirelessly communicate with the remote control device.

Additionally, the system may be characterized in that the wireless communication of the wireless control device is based on RFID or a Bluetooth connection. Preferably, the wireless control device may be installable on a mobile device, i.e. the wireless control device may be an application (App) on a smart phone or smart tablet etc.

Any one of the embodiments, examples or features disclosed herein may be used in combination or separately and in conjunction with any one of the aspect of the disclosed subject matter, mutatis mutandis.

BRIEF DESCRIPTION OF THE DRAWINGS

The accompanying drawings, which are incorporated in and constitute a part of this specification, illustrate several examples of the disclosed subject matter. The drawings show the following:

FIG. 5 depicts anatomy of the tongue and associated muscles and nerves according to an exemplary embodiment of the present disclosure;

DETAILED DESCRIPTION OF THE EXEMPLARY EMBODIMENTS

Figure 1:
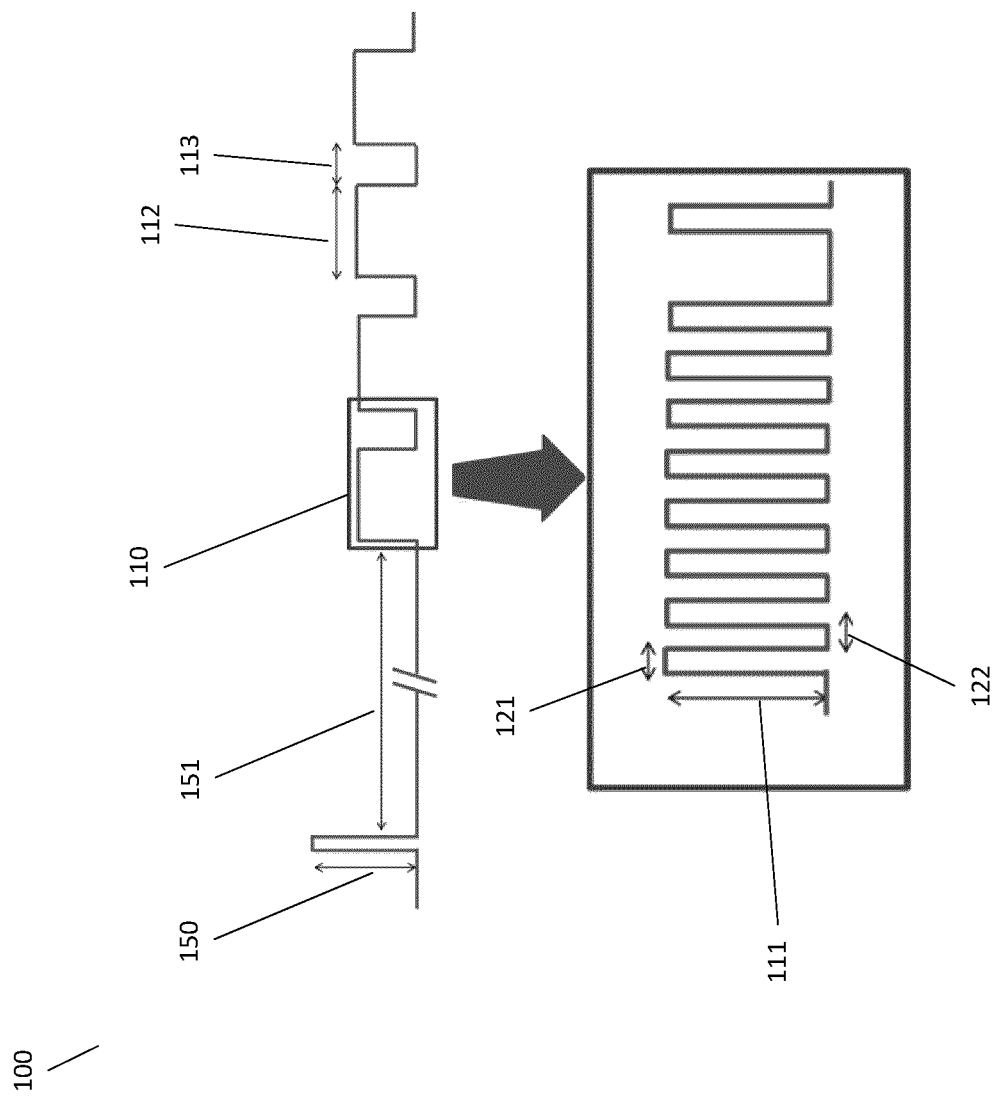
FIG. 1 depicts a schematic graph illustrating a detailed electrical stimulation pattern 100 100 according to an exemplary embodiment of the present disclosure.

FIG. 1 depicts a schematic graph illustrating a detailed electrical stimulation pattern 100 according to an exemplary embodiment of the present disclosure. In particular, the schematic graph shows the following parameters of the electrical stimulation pattern 100: delay time 151; confirmatory pulse 150; pulse train length 112; pulse train interval 113; pulse train amplitude 111; single pulse duration 121; single pulse intervals 122. Furthermore, a specific duty cycle may be inferred from the graph shown in FIG. 1. More particular, as shown in FIG. 1, one pulse train 110 comprises several single pulses 120, which are all separated from each other by single pulse intervals 122. The number of single pulses 120 per unit time is defined as the single pulse frequency 123. Likewise, the individual pulse trains 110 are separated from each other by pulse train intervals 113.

The electrical stimulation pattern 100 as shown in FIG. 1 is very basic, meaning that all single pulses have the same amplitude, with the confirmatory pulse 150 being the sole exception. Thus, no ramp-up or step-down functions are depicted in this graph.

Figure 2:
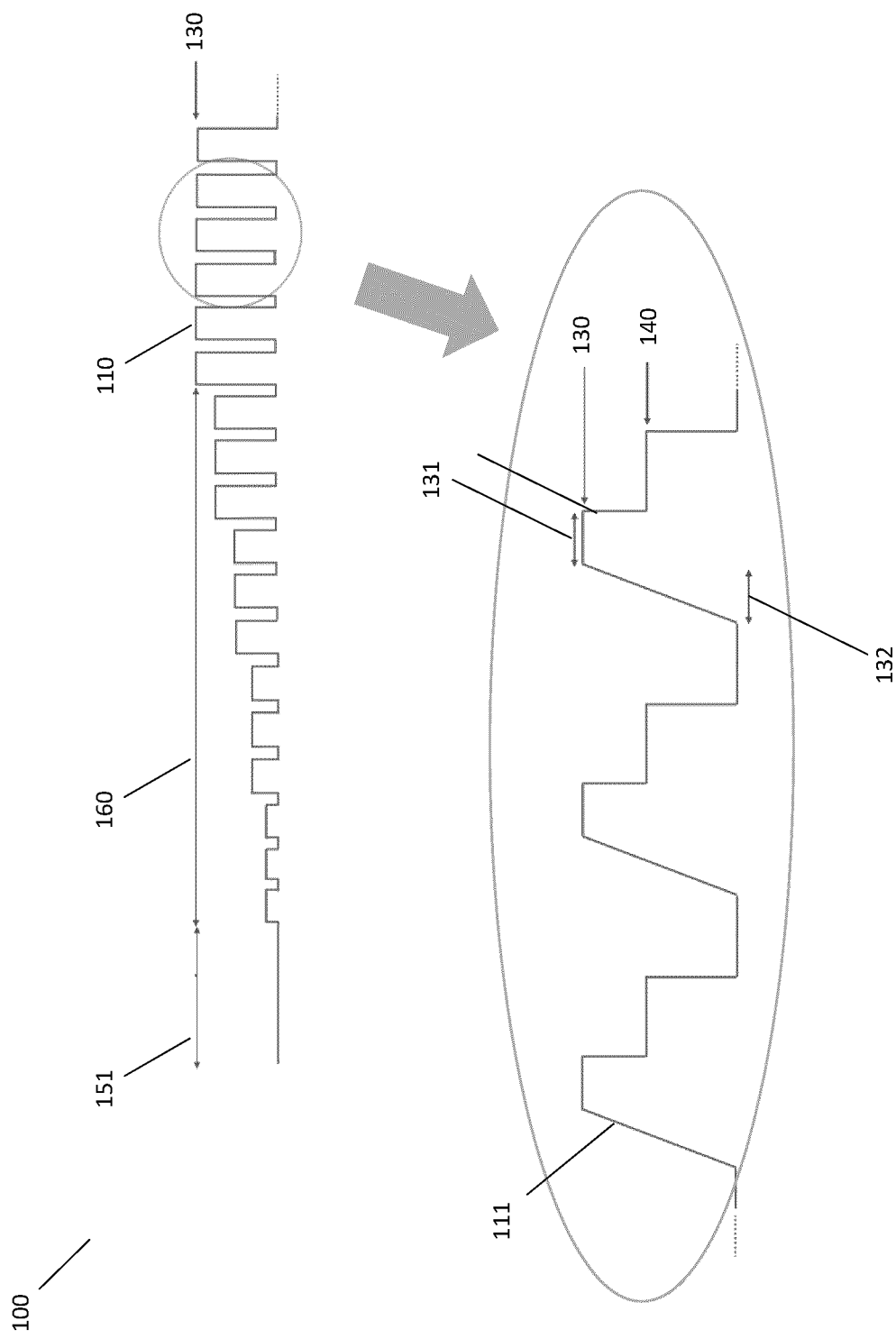
FIG. 2 depicts a schematic graph illustrating a detailed electrical stimulation pattern 100 100 during modulation according to another exemplary embodiment of the present disclosure.

FIG. 2 depicts a schematic graph illustrating a detailed electrical stimulation pattern 100 during modulation according to another exemplary embodiment of the present disclosure. In particular, an electrical stimulation pattern 100 is shown where modulation of the electrical stimulation pattern 100 comprises a gradual increase 160 of the pulse train amplitude 111 from one pulse train 110 to a successive pulse train 110 at stimulation onset 101, until a determined target stimulation amplitude 130 is reached. It is possible for the single pulses making up one pulse train 110 to either all have the same amplitude or to have different amplitudes. For example, the amplitudes of the single pulses within one pulse train 110 may also be increased incrementally with respect to each other (not shown in FIG. 2).

This feature can assist in increasing therapy acceptance by gradually increasing the amplitude up to the target stimulation amplitude 130 (in order to open the upper airway without waking up the patient 500), to hold this target stimulation amplitude 130 during a shorter period of time and then decrease the amplitude 111 as the force needed to maintain the upper airway open should be lower than the one needed to open a closed upper airway.

In addition to the gradual increase 160 during stimulation onset 101, FIG. 2 also shows modulation of the electrical stimulation pattern 100 in form of decreasing the target stimulation amplitude 130 to a defined Step-down amplitude 140 within each pulse train 110 after the target stimulation amplitude 130 was reached via a ramp-up having a defined ramp-up duration 132. In particular, according to the variation shown in FIG. 2, the target stimulation amplitude 130 is decreased to the Step-down amplitude 140 in a more or less abrupt manner. In other words, decreasing the target stimulation amplitude 130 to a defined Step-down amplitude 140 within each pulse train 110 after the target stimulation amplitude 130 was reached may involve one distinct drop in amplitude until the defined Step-down amplitude 140 is reached. It is also possible that more drops to one or more intermediate amplitudes are executed before the defined Step-down amplitude 140 is reached. The duration of each intermediate amplitude may then be the same for each intermediate amplitude, or it may vary.

Further, as depicted in FIG. 2, the target stimulation amplitude 130 within each pulse train 110 may be reached according to a ramp-up function comprising a ramp-up duration 132. The ramp-up duration 132 is defined as the time it takes for the pulse train amplitude 111 to reach the target stimulation amplitude 130. Advantageously, although not expressly shown by FIG. 2, the target stimulation amplitude 130 may be maintained for a defined hold duration 131 before it is decreased to the Step-down amplitude 140. According to a preferred embodiment, the hold duration 131 ranges from 0 msec to 1000 msec, in particular from 0 msec to 500 msec, wherein the hold duration 131 is defined as the duration of the period during which a target stimulation amplitude 130 is maintained within one stimulation train.

FIG. 3a-3d depict different schematic graphs each illustrating a possible pattern of a pulse train 110 during modulation according to different exemplary embodiments of the present disclosure. The graphs display a pulse train amplitude 111 (Y-axis) over time (X-axis). In particular, different types of ramp-up and/or step-down modulations are depicted, wherein a ramp-up is defined as increasing the pulse train amplitude within one pulse train 110 until the target stimulation amplitude 130 is reached according to a ramp-up function comprising a ramp-up duration 132. The point, at which target stimulation amplitude 130 is reached is defined as ramp-up point 133—The ramp-up duration 132 is defined as the time it takes for the pulse train amplitude 111 to reach the target stimulation amplitude 130 a gradual increase 160 of the pulse train amplitude 111 from one pulse train 110 to a successive pulse train 110 at stimulation onset 101 consists of gradually increasing the pulse train amplitude 111 from one stimulation train to another until a target stimulation amplitude 130 is reached and wherein a step-down is defined as decreasing the target stimulation amplitude 130 to a defined Step-down amplitude 140 within each pulse train 110 as disclosed herein.

A ramp-up has the effect that awaking the patient 500 after initialization of the stimulation might be avoided. The gradual increase 160 may, for example, include only one configurable parameter, namely duration, i.e. a period a time just after the delay time 151 during which the amplitude will increase gradually.

A step-down has at least two major advantages. One advantage lies in the fact that nerve fibers that have been initially affected or triggered via a stimulation signal need not necessarily be further stimulated with the same amount energy, i.e. a lower pulse train amplitude 111 or frequency might be as efficient in maintaining nerve affection as the initial amplitude or frequency. Also, once a muscle has been engaged via stimulation it will contract. As soon as such a muscle contraction has been activated, the distance between an external device 400 generating the stimulation in the muscle and the muscle itself will be decreased, since at least a part of the muscle will be closer to the skin surface of a patient 500 due to contraction. Thus, the distance between the external device 400 and the stimulator 300 is decreased. At the same time, less intervening tissue will be located between the external device 400 and the stimulator 300. Intervening tissue 530 may include muscle tissue, connective tissue, organ tissue, or any other type of biological tissue. Again, this means that a lower pulse train amplitude 111 or frequency might be needed to maintain recruitment of the muscle as compared to the initial amplitude or frequency.

Figure 3B:
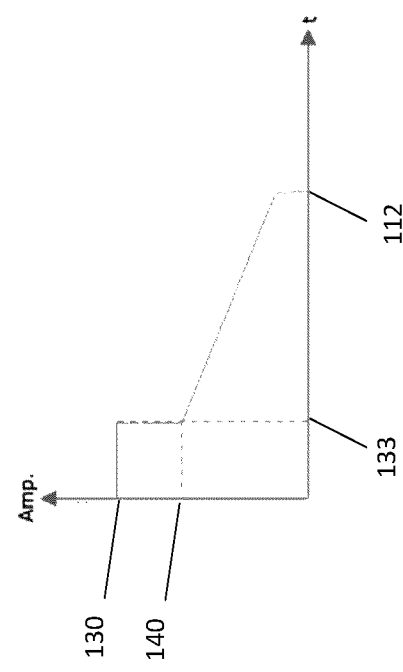
FIG. 3a-3d depict different schematic graphs each illustrating a possible pattern of a pulse train 110 during modulation according to different exemplary embodiments of the present disclosure.
Figure 3D:
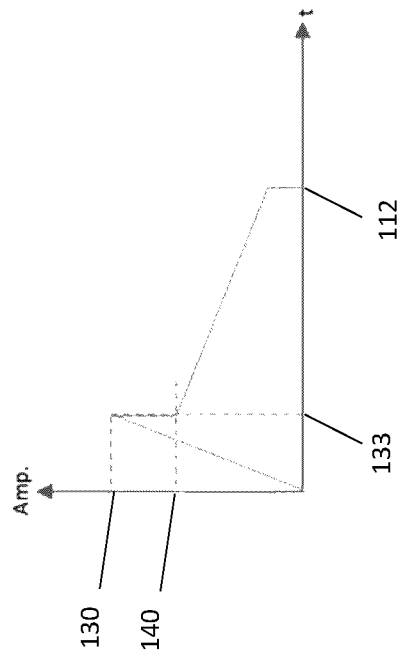
Figure 3A:
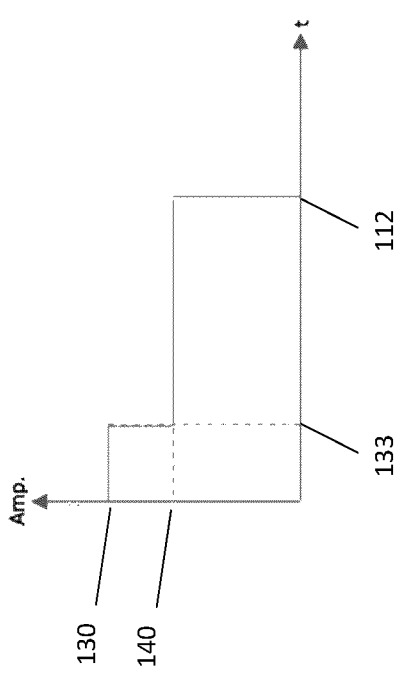

According to the embodiment shown in FIG. 3a, the target stimulation amplitude 130 is already reached. As shown, according to this particular embodiment, a decrease of the target stimulation amplitude 130 to the step-down amplitude 140 is achieved in an abrupt manner. In other words, decreasing the target stimulation amplitude 130 to a defined step-down amplitude 140 within each pulse train 110 after the target stimulation amplitude 130 has been reached may involve one distinct drop in amplitude until the defined step-down amplitude 140 is reached. When the pulse train 110 ends and no single pulses occur, the step-down amplitude 140 abruptly drops to 0. According to the embodiment shown in FIG. 3*b*, after the target stimulation amplitude 130 has dropped to the step-down amplitude 140, the step-down amplitude 140 is further reduced to 0 in a continuous manner.

Figure 3C:
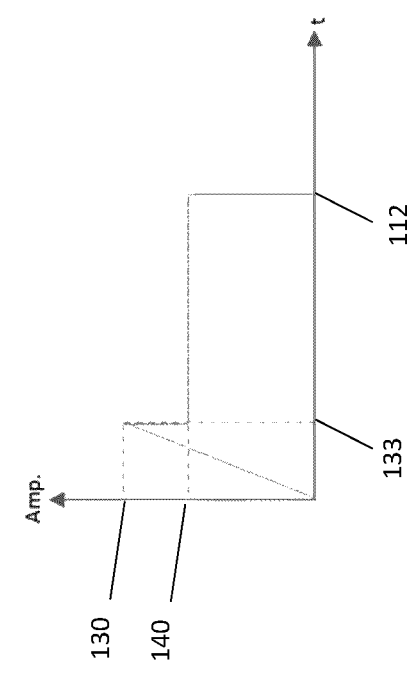

FIG. 3*c* and FIG. 3*d* show the same types of step-down modulations within a pulse train 110 as FIG. 3*a* and FIG. 3*b*, respectively. However, in the exemplary embodiments shown in FIG. 3*c* and FIG. 3*d*, the target stimulation amplitude 130 is first reached through a continuous ramp-up of the pulse train amplitude 111. The point time in time within each pulse train 110, at which the defined target stimulation amplitude 130 is reached, may be referred to as ramp-up point 133.

Figure 4:
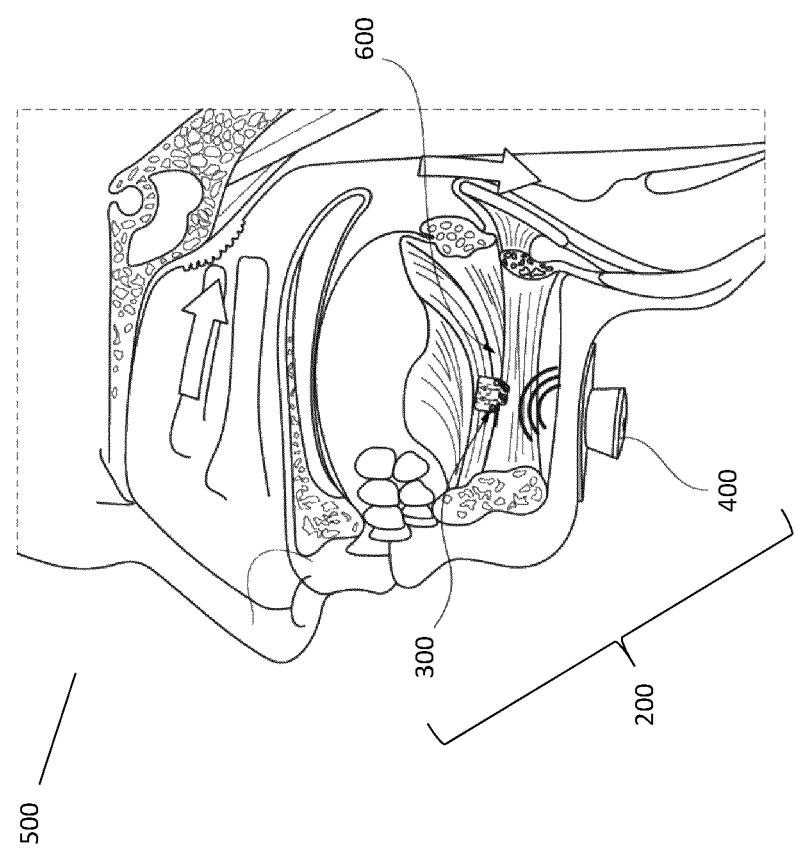
FIG. 4 depicts a partially cross-sectioned side view of a patient 500 with a system 200 according to an exemplary embodiment of the present disclosure.

FIG. 4 depicts a partially cross-sectioned side view of a patient 500 with a system 200 according to an exemplary embodiment of the present disclosure. The system 200 is configured for neuromodulation of a patient's muscle. More particularly, the system 200 may be configured to deliver energy in a patient 500 with OSA. The system 200 may therefore include an external device 400 configured for location external to the patient's body. As depicted in FIG. 4, the external device 400 may be configured to be affixed to the patient 500. In particular, as shown in FIG. 4, the external device 400 may be configured for placement underneath the patient's chin and/or on the front of the patient's neck. The suitability of placement locations may be determined by communication between the external device 400 and the stimulator 300. Further suitable locations of the external device 400 include the back of a patient's head for communication with a migraine treatment stimulator 300, the outer portion of a patient's abdomen for communication with a stomach modulating stimulator 300, a patient's back for communication with a renal artery modulating stimulator 300 and/or any other suitable external location on a patient's skin, depending on the requirements of a particular application.

As noted, the stimulator 300 may be configured to be implanted in a patient's body (e.g. beneath the patient's skin). FIG. 4 and FIG. 5 illustrate that the stimulator 300 may be configured to be implanted for modulation of a nerve associated with the genioglossal muscle. Modulating a nerve associated with a muscle of the subject's tongue may include stimulation to cause a muscle contraction. In further embodiments, the stimulator 300 may be configured to be placed in conjunction with any nerve that one may desire to modulate.

FIG. 5 depicts anatomy of the tongue and associated muscles and nerves (i.e. hypoglossal nerve (XII)) according to an exemplary embodiment of the present disclosure. FIG. 5 further depicts nerve 510. The nerve 510, through its lateral branch and medial branch, innervates the muscles of the tongue and other glossal muscles, including the genioglossus muscle and the geniohyoid muscle. The horizontal compartment of the genioglossus is mainly innervated by the medial terminal fibers of the medial branch of the nerve 510, which diverges from the lateral branch at terminal bifurcation. The distal portion of the medial branch then *variegates* into the medial terminal fibers. Contraction of the horizontal compartment of the genioglossus muscle may serve to open or maintain a subject's airway. Contraction of other glossal muscles may assist in other functions, such as swallowing, articulation and opening or closing of the airway. Because the hypoglossal nerve 510 innervates several glossal muscles, it may be advantageous for OSA treatment, to confine modulation of the nerve 510 to the medial branch, or maybe even to the medial terminal fibers or the terminal fibers of the nerve 510. This way, the genioglossus muscle, most responsible for tongue movement and airway maintenance, may be selectively targeted for contraction inducing neuromodulation. Alternatively, the horizontal compartment of the genioglossus muscle may be selectively targeted.

The medial terminal fibers or the terminal fibers may, however, be difficult to affect with neuromodulation, since they are located within the fibers of the genioglossus muscle. Embodiments of the present disclosure facilitate modulation of any such terminal fibers. In some embodiments the stimulator 300, including at least one pair of modulation electrodes 310 and at least one circuit may be configured for implantation through derma on an underside of a subject's chin. When implanted through derma on an underside of a subject's chin, the stimulator 300 may be located proximate to medial terminal fibers of the medial branch of a subject's hypoglossal nerve 510. An exemplary stimulator 300 location is depicted in FIG. 5. Furthermore, the efficacy of modulation may be increased by an electrode configuration suitable for gene rating parallel electric field lines that run partially or substantially parallel to the nerve fibers to be modulated. FIG. 5 depicts electrodes 310 generating electric field lines (shown as dashed lines) substantially parallel to medial terminal fibers.

Figure 6B:
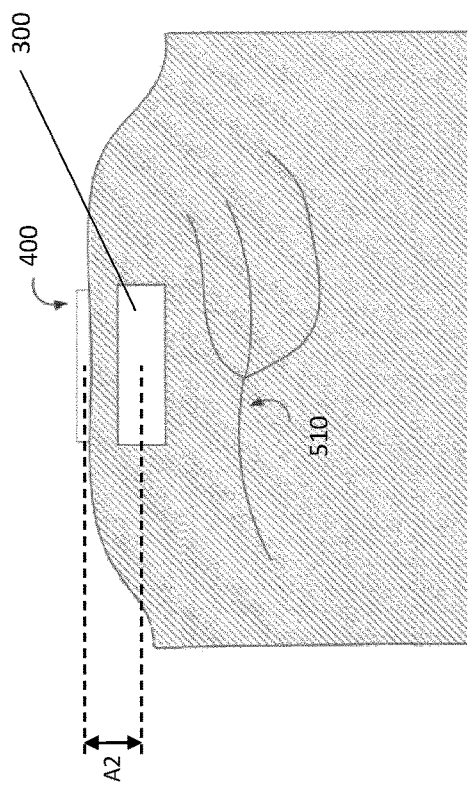
FIG. 6a-6b depict schematic illustrations of a stimulator 300 and an external device 400 according to an exemplary embodiment of the present disclosure.
Figure 6A:
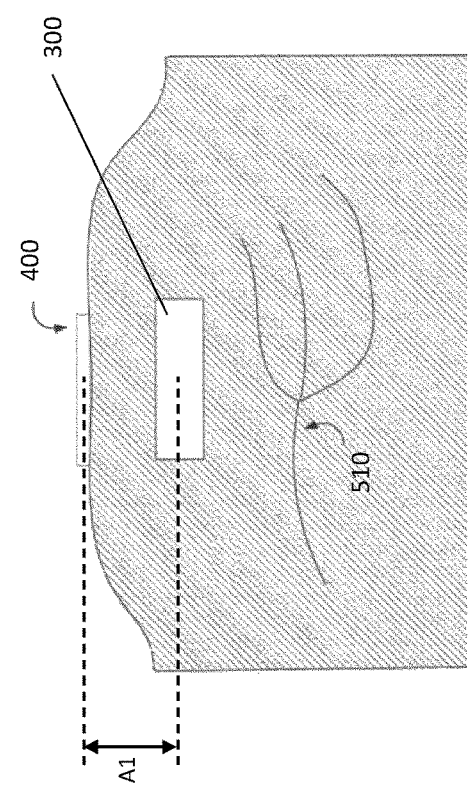

FIG. 6*a*-6*b* depict schematic illustrations of a stimulator 300 and an external device 400 according to an exemplary embodiment of the present disclosure. As is shown, the stimulator 300 may be configured for implantation in a patient 500, preferably in a location that permits it to modulate a nerve. The stimulator 300 may, in particular, be located in a patient 500 in such way that intervening tissue exists between the stimulator 300 and the hypoglossal nerve 510. Thus, the location of the stimulator 300 does not require contact with the nerve for effective neuromodulation. The stimulator 300 may also be located directly adjacent to the nerve 510, such that no intervening tissue exists.

In treating OSA, the stimulator 300 may be located on a genioglossus muscle of a patient 500. Such a location is suitable for modulation of the hypoglossal nerve 510, branches of which run at the genioglossus muscle.

As is shown in FIG. 6*a*, when the muscle is at rest, i.e. not contracted, the distance A1 between an external device 400 generating the stimulation of the muscle and the muscle itself will be relatively large. Likewise, the distance A1 between the external device 400 and the implanted stimulator 300 is relatively large, too, and much tissue is located between the external device 400 and the stimulator 300. Therefore, initial engagement of the nerve 510 requires a high intensity of stimulation.

Once a muscle contraction has been achieved, the distance A2 between the external device 400 generating the stimulation in the muscle and the muscle itself will be decreased, as depicted in FIG. 6*b*. Since at least a part of the muscle will be closer to the skin surface of a patient 500 due to contraction, the distance between the external device 400 and the stimulator 300 is decreased, as well. At the same time, less intervening tissue will be located between the external device 400 and the stimulator 300. This means that a lower pulse train amplitude 111 or frequency is needed to maintain recruitment of the muscle as compared to the initial amplitude or frequency of the stimulation. In other words, a stimulation with a lower intensity is sufficient to maintain muscle contraction.

The invention is not limited to one of the embodiments described herein but may be modified in numerous other ways.

All features disclosed by the claims, the specification and the figures, as well as all advantages, including constructive particulars, spatial arrangements and methodological steps, can be essential to the invention either on their own or by various combinations with each other.

LIST OF REFERENCE NUMERALS

100 Electrical stimulation pattern
101 Stimulation onset
110 Pulse train
111 Pulse train amplitude
112 Pulse train length
113 Pulse train interval
120 Single pulse
121 Single pulse duration
122 Single pulse interval
130 Target stimulation amplitude
131 Hold duration
132 Ramp-up duration
133 Ramp-up point
140 Step-down amplitude
150 Confirmatory pulse
151 Delay time
160 Gradual increase
200 System
300 Stimulator
310 Electrodes
400 External device
500 Patient
510 Nerve
530 Intervening tissue
600 Genioglussos muscle
A1, A2 Distance

The invention claimed is:

1. A method for electrical nerve stimulation, the method comprising:
generating an electrical stimulation pattern comprising a plurality of successive pulse trains, wherein each pulse train has a pulse train amplitude;
delivering the electrical stimulation pattern to a subject's nerve with a stimulator having at least one electrode set;
modulating the electrical stimulation pattern, wherein modulation of the electrical stimulation pattern comprises gradually increasing the pulse train amplitude from one pulse train to a successive pulse train at a stimulation onset until a determined target stimulation amplitude within each pulse train is reached, wherein
a ramp-up duration of gradually increasing the pulse train amplitude within each simulation train is greater than 0 msec and less than or equal to 2000 msec; and wherein
modulation of the electrical stimulation pattern further comprises decreasing the target stimulation amplitude to a defined step-down amplitude within each pulse train after the target stimulation amplitude was reached.

2. The method of claim 1, wherein the target stimulation amplitude is decreased to the step-down amplitude in a defined time duration.

3. The method of claim 1, wherein the target stimulation amplitude within each pulse train is reached according to a ramp-up function comprising the ramp-up duration, wherein the ramp-up duration is defined as the time it takes for the pulse train amplitude to reach the target stimulation amplitude.

4. The method of claim 1, wherein the target stimulation amplitude is maintained for a defined hold duration before it is decreased to the step-down amplitude.

5. The method of claim 1, wherein each of the successive pulse trains are separated by pulse train intervals.

6. The method of claim 1, wherein each pulse train of the plurality of successive pulse trains comprises a plurality of successive pulses, wherein each pulse of the plurality of successive pulses has a single pulse amplitude and a single pulse duration and wherein successive pulses are separated by single pulse intervals.

7. The method of claim 1, wherein each pulse train of the plurality of successive pulse trains has a pulse train length and a pulse train interval, together defining a pulse train frequency and a duty cycle.

8. The method of claim 1, wherein modulating the electrical stimulation pattern is based on determining a degree of coupling between a primary antenna associated with an external device and a secondary antenna associated with an implantable stimulator.

9. The method of claim 1, wherein the electrical stimulation pattern further comprises a confirmatory pulse and a delay time.

10. The method of claim 1, wherein the duration of the gradual increase of the pulse train amplitude from one pulse train to a successive pulse train at stimulation onset ranges from 0 min to 90 min.

11. The method according to claim 4, wherein the hold duration ranges from 0 msec to 1000 msec.

12. The method of claim 1, wherein the step-down amplitude has an amplitude from 1% to 99% of a total system output amplitude.

13. The method of claim 1, wherein the pulse train amplitude has an amplitude from 1% to 100% of a total system output amplitude.

14. The method of claim 1, wherein the duration of a pulse train interval ranges from 0.1 sec to 20 sec.

15. The method of claim 1, wherein a single pulse duration ranges from 5 μsec to 500 μsec.

16. The method of claim 1, wherein a duration of a pulse train length ranges from 0.1 sec to 20 sec and that the pulse frequency within train ranges from 10 Hz to 100 Hz.

17. The method of claim 1, wherein a confirmatory pulse has an amplitude from 1% to 100% of the total system output amplitude and that a duration of a delay time ranges from 0 min to 120 min.

18. The method of claim 1, wherein the method is used in a wakeful titration.

19. The method of claim 18, wherein the method is used to define a motor threshold stimulation amplitude for a defined single pulse frequency of a pulse train of the plurality of successive pulse trains and a defined single pulse duration of the pulse train of the plurality of successive pulse trains.

20. The method of claim 18, wherein the method is used to define a discomfort threshold stimulation amplitude for a defined single pulse frequency of a pulse train of the plurality of successive pulse trains and a defined single pulse duration of the pulse train of the plurality of successive pulse trains.

21. The method of claim 1, wherein the method is used in a wakeful endoscopy.

22. The method of claim 21, wherein the method is used to define an airway opening amplitude, wherein the airway opening amplitude is the minimum stimulation amplitude required to cause an opening of the subject's airway during stimulation.

23. The method of claim 21, wherein the method is used to a define a plateau amplitude, wherein the plateau amplitude is the maximum stimulation amplitude above which no further increase of the opening of the subject's airway is caused.

24. The method of claim 1, wherein the method is used in a polysomnography titration.

25. A method for electrical nerve stimulation, the method comprising:
- generating an electrical stimulation pattern comprising a plurality of successive pulse trains, wherein each pulse train has a pulse train amplitude;
- delivering the electrical stimulation pattern to a subject's nerve with a stimulator having at least one electrode set;
- modulating the electrical stimulation pattern, wherein modulation of the electrical stimulation pattern comprises gradually increasing the pulse train amplitude from one pulse train to a successive pulse train at a stimulation onset until a determined target stimulation amplitude within each pulse train is reached; wherein
- modulation of the electrical stimulation pattern further comprises decreasing the target stimulation amplitude to a defined step-down amplitude within each pulse train after the target stimulation amplitude was reached, and
- the duration of a pulse train interval ranges from 0.1 sec to 20 sec.

26. A method for electrical nerve stimulation, the method comprising:
- generating an electrical stimulation pattern comprising a plurality of successive pulse trains, wherein each pulse train has a pulse train amplitude;
- delivering the electrical stimulation pattern to a subject's nerve with a stimulator having at least one electrode set;
- modulating the electrical stimulation pattern, wherein modulation of the electrical stimulation pattern comprises gradually increasing the pulse train amplitude from one pulse train to a successive pulse train at a stimulation onset until a determined target stimulation amplitude within each pulse train is reached; wherein
- modulation of the electrical stimulation pattern further comprises decreasing the target stimulation amplitude to a defined step-down amplitude within each pulse train after the target stimulation amplitude was reached, and
- a single pulse duration ranges from 5 µsec to 500 µsec.

* * * * *